United States Patent
Yu et al.

(10) Patent No.: US 11,265,482 B2
(45) Date of Patent: Mar. 1, 2022

(54) POSITION DETECTING DEVICE OF APERTURE MODULE

(71) Applicant: Samsung Electro-Mechanics Co., Ltd., Suwon-si (KR)

(72) Inventors: Je Hyeon Yu, Suwon-si (KR); Ji Buem Chun, Suwon-si (KR); Ja Hwi Cho, Suwon-si (KR); Sang Hyun Min, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 60 days.

(21) Appl. No.: 16/852,845

(22) Filed: Apr. 20, 2020

(65) Prior Publication Data

US 2021/0203823 A1     Jul. 1, 2021

(30) Foreign Application Priority Data

Dec. 27, 2019   (KR) .................... 10-2019-0176824

(51) Int. Cl.
| | |
|---|---|
| *H04N 5/238* | (2006.01) |
| *H04N 5/225* | (2006.01) |
| *G01D 5/14* | (2006.01) |
| *H03F 3/45* | (2006.01) |

(52) U.S. Cl.
CPC ............ *H04N 5/238* (2013.01); *G01D 5/142* (2013.01); *H04N 5/2254* (2013.01); *H03F 3/45475* (2013.01)

(58) Field of Classification Search
CPC ...... H04N 5/238; H04N 5/2254; G01D 5/142; H03F 3/45475
See application file for complete search history.

(56) References Cited

U.S. PATENT DOCUMENTS

| | | | | |
|---|---|---|---|---|
| 4,746,859 A | * | 5/1988 | Malik .................... | G01D 5/145 324/207.12 |
| 4,864,147 A | * | 9/1989 | Ikari .................... | G01B 11/026 250/559.22 |
| 8,941,051 B2 | * | 1/2015 | Ohno ................. | G01D 5/34746 250/231.13 |

(Continued)

FOREIGN PATENT DOCUMENTS

| | | |
|---|---|---|
| EP | 2 012 094 A1 | 1/2009 |
| JP | 2013083597 A * | 5/2013 |

(Continued)

*Primary Examiner* — Abdelaaziz Tissire
(74) *Attorney, Agent, or Firm* — NSIP Law

(57) ABSTRACT

A position detecting device for detecting a position of a magnet configured to move over a first target point and a second target point in steps includes a first hall device configured to generate a first hall voltage, a second hall device configured to generate a second hall voltage, a subtractor configured to generate a subtraction voltage based on a difference between the first hall voltage and the second hall voltage, an adder configured to generate an addition voltage based on a combination of the first hall voltage and the second hall voltage, a divider configured to calculate a ratio of the subtraction voltage to the addition voltage, and a subtraction voltage changing unit configured to maintain the subtraction voltage at the first target point and the second target point and in a transition section between the first target point and the second target point to be constant.

23 Claims, 8 Drawing Sheets

(56) References Cited

U.S. PATENT DOCUMENTS

| | | | |
|---|---|---|---|
| 8,995,241 B1 | 3/2015 | Heo et al. | |
| 9,625,496 B2* | 4/2017 | Futakuchi | G01R 15/205 |
| 2004/0013420 A1* | 1/2004 | Hara | H02N 2/067 |
| | | | 396/55 |
| 2005/0073293 A1* | 4/2005 | Hastings | G01R 15/202 |
| | | | 324/117 H |
| 2005/0232094 A1* | 10/2005 | Hoshino | G01D 5/145 |
| | | | 369/44.11 |
| 2005/0258822 A1* | 11/2005 | Hara | H04N 5/23248 |
| | | | 324/207.2 |
| 2005/0258825 A1* | 11/2005 | Masuda | G03B 17/02 |
| | | | 324/207.26 |
| 2005/0259156 A1* | 11/2005 | Kosaka | H04N 5/23287 |
| | | | 348/208.7 |
| 2006/0170418 A1* | 8/2006 | Hata | G03B 5/00 |
| | | | 324/207.24 |
| 2008/0177500 A1* | 7/2008 | Yamazaki | H02P 29/685 |
| | | | 702/150 |
| 2009/0039875 A1* | 2/2009 | Hoshino | G01D 5/24476 |
| | | | 324/207.21 |
| 2009/0177436 A1* | 7/2009 | Yoshida | G01D 5/145 |
| | | | 702/150 |
| 2011/0122311 A1* | 5/2011 | Han | H02K 33/16 |
| | | | 348/362 |
| 2018/0213137 A1* | 7/2018 | Park | G02B 7/04 |
| 2018/0284571 A1* | 10/2018 | Park | G03B 9/02 |
| 2018/0299644 A1* | 10/2018 | Lee | G03B 3/10 |
| 2018/0343370 A1* | 11/2018 | Park | G02B 13/001 |
| 2019/0049692 A1* | 2/2019 | Choi | G03B 9/06 |
| 2019/0137844 A1* | 5/2019 | Park | G02B 5/20 |
| 2019/0141219 A1* | 5/2019 | Oh | H04N 5/2254 |
| 2020/0153366 A1* | 5/2020 | I | G02B 27/646 |

FOREIGN PATENT DOCUMENTS

| | | |
|---|---|---|
| JP | 5715023 B2 | 5/2015 |
| KR | 10-1057951 B1 | 8/2011 |
| KR | 10-1588951 B1 | 1/2016 |

* cited by examiner

POSITION DETECTING DEVICE OF APERTURE MODULE

CROSS-REFERENCE TO RELATED APPLICATIONS

This application claims the benefit under 35 USC 119(a) of Korean Patent Application No. 10-2019-0176824 filed on Dec. 27, 2019, in the Korean Intellectual Property Office, the entire disclosure of which is incorporated herein by reference for all purposes.

BACKGROUND

1. Field

The present disclosure relates to a position detecting device of an aperture module.

2. Description of the Background

Generally, portable communications terminals such as mobile phones, personal digital assistants (PDAs), portable personal computers (PCs), and the like, have been designed to transmit text data or voice data and to also transmit image data. Accordingly, camera modules have been installed in portable communication terminals to provide transmission of image data and video chat functions.

A camera module may include an aperture module for adjusting an amount of light incident to a lens barrel. An aperture module may move an aperture to a target point by electromagnetic interaction between a coil and a magnet. An aperture module may detect a current position of an aperture by sensing a position of a magnet using a hall device.

A hall voltage of a hall device, however, may change according to changes in temperature. Thus, it may be necessary to compensate for changes in hall voltage caused by changes in temperature to detect an accurate position of a magnet or an aperture.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a position detecting device for detecting a position of a magnet configured to move over a first target point and a second target point in steps includes a first hall device configured to generate a first hall voltage, a second hall device configured to generate a second hall voltage, a subtractor configured to generate a subtraction voltage based on a difference between the first hall voltage and the second hall voltage, an adder configured to generate an addition voltage based on a combination of the first hall voltage and the second hall voltage, a divider configured to calculate a ratio of the subtraction voltage to the addition voltage, and a subtraction voltage changing unit configured to maintain the subtraction voltage at the first target point and the second target point and in a transition section between the first target point and the second target point to be constant.

The first hall device and the second hall device may be disposed in a moving direction of the magnet.

The subtraction voltage changing unit may be configured to change the subtraction voltage of the transition section to a subtraction voltage of a target point before the transition section, where the target point is the first target point or the second target point.

The subtraction voltage changing unit may be configured to apply a correction coefficient to one of the first hall voltage and the second hall voltage.

The subtraction voltage at the first target point and the subtraction voltage at the second target point may be maintained to be the same by the correction coefficient.

The correction coefficient may be applied to the first hall voltage, and the correction coefficient may be calculated in accordance with a ratio of a difference between the first hall voltage at the first target point and the first hall voltage at the second target point to a difference between the second hall voltage at the first target point and the second hall voltage at the second target point.

The position detecting device may further include a differential amplifier configured to differential-amplify output voltages output by the first hall device to generate the first hall voltage, and to differential-amplify output voltages output by the second hall device to generate the second hall voltage.

An aperture module may include a driver configured to output a driving signal to a coil to move the magnet to the first target point, the second target point, and in the transition section, in response to an input signal and a feedback signal, an aperture configured to adjust an amount of light through the aperture in response to movement of the magnet, and the position detecting device configured to input the ratio of the subtraction voltage to the addition voltage as changed by the subtraction voltage changing unit to the driver in the feedback signal.

A camera module may include a lens barrel disposed in a housing, the aperture module configured to adjust an amount of light incident to the lens barrel, and an image sensor configured to convert incident light through the lens barrel into an electrical signal.

In another general aspect, a position detecting device for detecting a position of a magnet configured to move over a first target point, a second target point, and a third target point in steps includes a first hall device configured to generate a first hall voltage, a second hall device configured to generate a second hall voltage, a subtractor configured to generate a subtraction voltage of a difference between the first hall voltage and the second hall voltage, an adder configured to generate an addition voltage of a combination of the first hall voltage and the second hall voltage, a divider configured to configured to calculate a ratio of the subtraction voltage to the addition voltage, and a subtraction voltage changing unit configured to maintain the subtraction voltage at two adjacent target points among the first target point, the second target point, and the third target point and in a transition section between the two adjacent target points to be constant.

The subtraction voltage changing unit may be configured to change the subtraction voltage at a first transition section between the first target point and the second target point to a subtraction voltage lastly obtained at the first target point before the first transition section.

The subtraction voltage changing unit may be configured to apply a first correction coefficient to the subtraction voltage at the second target point after the first transition section and calculate a correction subtraction voltage at the second target point.

The first correction coefficient may correspond to a ratio of a subtraction voltage firstly obtained at the second target point to the subtraction voltage lastly obtained at the first target point.

The subtraction voltage changing unit may be configured to change a subtraction voltage in a second transition section between the second target point and the third target point to a correction subtraction voltage lastly obtained at the second target point before the second transition section.

The subtraction voltage changing unit may be configured to apply a second correction coefficient to a subtraction voltage at the third target point after the second transition section and calculate a correction subtraction voltage at the third target point.

The second correction coefficient may correspond to a ratio of a subtraction voltage firstly obtained at the third target point to the subtraction voltage lastly obtained at the second target point.

In another general aspect, a position detecting device includes first and second hall devices spaced apart in a moving direction of a magnet, a subtractor configured to determine a difference between outputs of the hall devices as a subtraction voltage, an adder configured to determine a summation of outputs of the hall devices as an addition voltage, a divider configured to determine a ratio of the subtraction voltage to the addition voltage, a subtraction voltage changing unit configured to maintain the subtraction voltage at a constant value when the magnet is in a transition position between target positions, wherein the magnet position in the transition position is determined by the ratio.

The constant value of the subtraction voltage may be a value determined at a last target position of the magnet prior to the transition position.

In another general aspect, a camera module includes a lens barrel disposed in a housing, an aperture including a magnet configured to move over targets, and in a transition section between the targets to adjust an amount of light incident to the lens barrel, a driver configured to output a driving signal to a coil to move the magnet over the targets and in the transition section, in response to an input signal and a feedback signal, a position detecting device configured to determine an amount of incident light through the aperture, the position detecting device including first and second hall devices spaced apart and configured to output voltages in response to the magnet position, a subtractor configured to determine a difference between outputs of the hall devices as a subtraction voltage, an adder configured to determine a combination of outputs of the hall devices as an addition voltage, a divider configured to determine a ratio of the subtraction voltage to the addition voltage, a subtraction voltage changing unit configured to maintain the subtraction voltage at a constant value when the magnet is in the transition section between target positions, and an image sensor configured to convert incident light through the lens barrel into an electrical signal, wherein the feedback signal includes the ratio of the subtraction voltage to the addition voltage output from the divider as changed by the subtraction voltage changing unit.

The first hall device and the second hall device may be spaced apart in a moving direction of the magnet.

The constant value of the subtraction voltage may be a value determined at a last target position of the magnet prior to the transition section.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
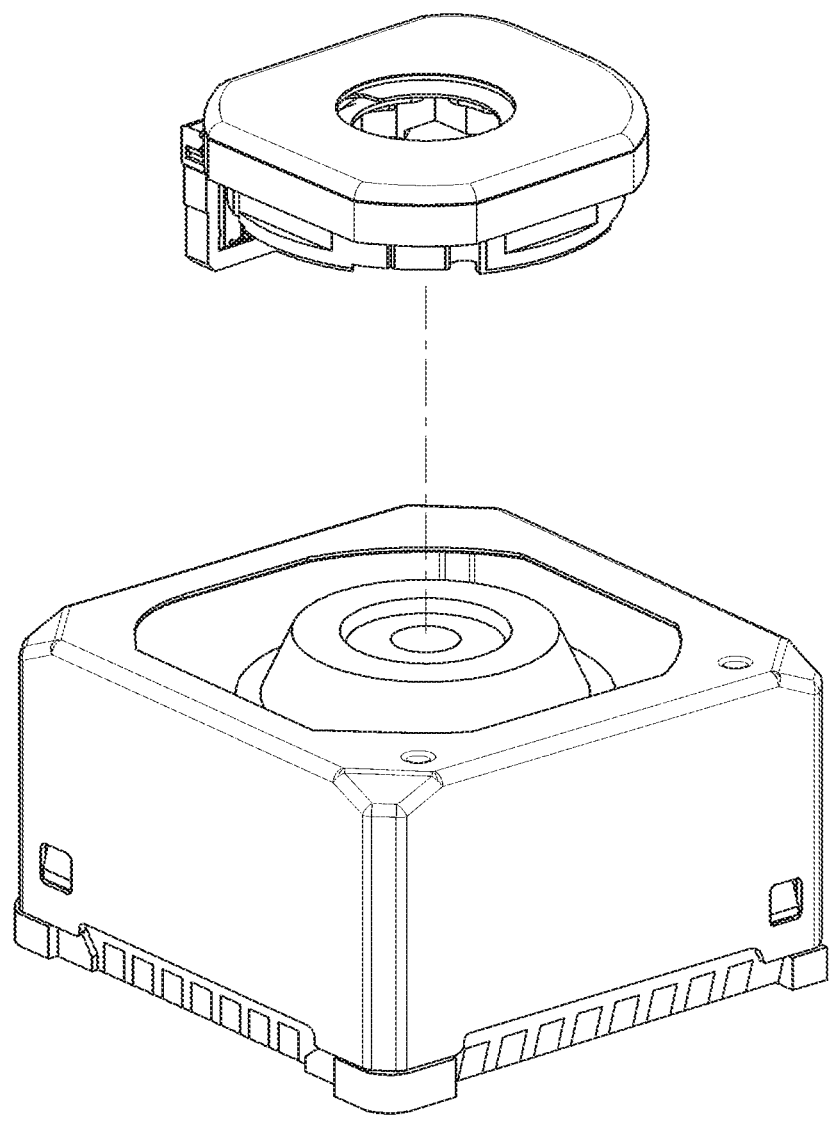
FIG. 1 is a perspective diagram illustrating a camera module according to one or more examples of the present disclosure.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

An aspect of the present disclosure is to provide a position detecting device of an aperture module which may compensate for changes in hall voltage caused by changes in temperature and may maintain linearity with respect to displacement of an aperture.

Figure 2:
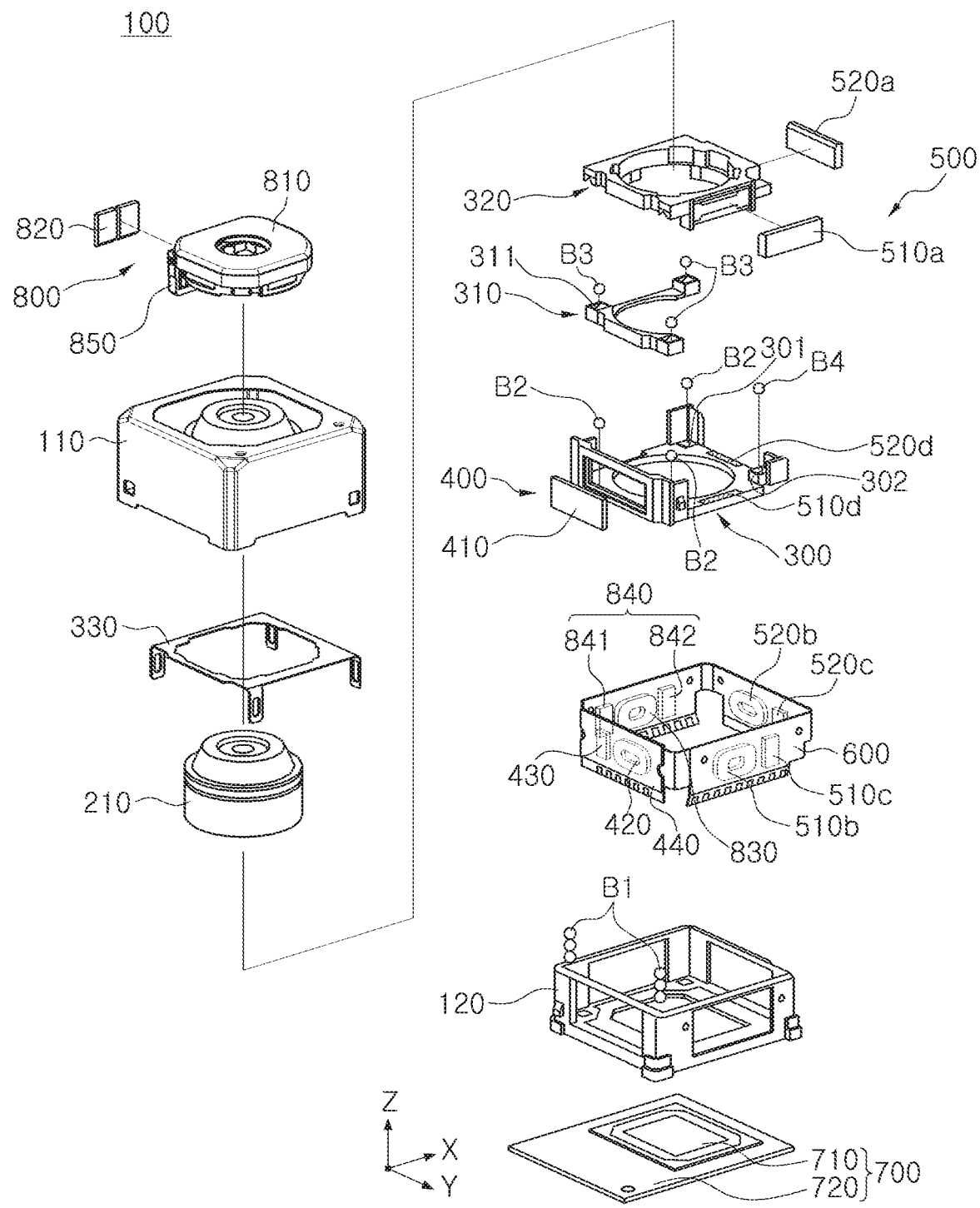
FIG. 2 is an exploded perspective diagram illustrating a camera module according to one or more examples of the present disclosure.

FIG. 1 is a perspective diagram illustrating a camera module according to one or more examples. FIG. 2 is an exploded perspective diagram illustrating a camera module according to one or more examples.

Referring to FIGS. 1 and 2, a camera module 100 in the one or more examples may include a lens barrel 210, an actuator for moving the lens barrel 210, a case 110 for accommodating the lens barrel 210 and the actuator, a housing 120, an image sensor module 700 converting light incident through the lens barrel 210 into an electrical signal, and an aperture module 800 adjusting an amount of light incident to the lens barrel 210.

The lens barrel 210 may have a cylindrical hollow shape such that a plurality of lenses for imaging an object may be accommodated in the lens barrel 210, and the plurality of lenses may be mounted on the lens barrel 210 along an optical axis. A desired number of plurality of lenses may be disposed in various examples, and the lenses may have the same refractive index and the same optical properties, or may have different refractive indices and different optical properties.

The actuator may move the lens barrel 210. As an example, the actuator may adjust a focus by moving the lens barrel 210 in a direction of an optical axis (Z axis), and the actuator may perform an image-shake correction function when an object is imaged by moving the lens barrel 210 in a direction perpendicular to the optical axis (Z axis). The actuator may include a focus adjustment unit 400 for adjusting a focus and a shake correction unit 500 for correcting the shaking of an image.

The image sensor module 700 may convert light incident through the lens barrel 210 into an electrical signal. As an example, the image sensor module 700 may include an image sensor 710 and a printed circuit board 720 connected to the image sensor 710, and may further include an infrared filter. The infrared filter may block infrared light of light incident through the lens barrel 210. The image sensor 710 may convert light incident through the lens barrel 210 into an electrical signal. As an example, the image sensor 710 may include a charge coupled device (CCD) or a complementary metal-oxide semiconductor (CMOS). An electrical signal converted by the image sensor 710 may be output as an image through a display unit of a portable electronic device. The image sensor 710 may be fixed to the printed circuit board 720, and may be electrically connected to the printed circuit board 720 by a wire bonding.

The lens barrel 210 and the actuator may be accommodated in the housing 120. As an example, an upper portion and a lower portion of the housing 120 may be configured to be open, and the lens barrel 210 and the actuator may be accommodated in the housing 120. The image sensor module 700 may be disposed below the housing 120.

The case 110 may be coupled to the housing 120 to enclose an external surface of the housing 120, and may protect internal components of the camera module 100. The case 110 may also shield electromagnetic waves. The case 110 may be formed of a metal material and may be grounded to a ground pad provided in the printed circuit board 720, and may shield electromagnetic waves.

In the examples, the actuator may move the lens barrel 210 to focus on an object. As an example, the actuator may include a focus adjustment unit 400 for moving the lens barrel 210 in the direction of the optical axis (Z axis).

The focus adjustment unit 400 may include a magnet 410 for generating driving force to move the lens barrel 210 and a carrier 300 in which the lens barrel 210 is accommodated in the direction of the optical axis (Z axis), and a coil 420.

The magnet 410 may be mounted on the carrier 300. As an example, the magnet 410 may be mounted on a first surface of the carrier 300. The coil 420 may be mounted on the housing 120 and may oppose the magnet 410. As an example, the coil 420 may be disposed on a first surface of a substrate 600, and the substrate 600 may be mounted on the housing 120.

The magnet 410 may be mounted on the carrier 300 and may move in the direction of the optical axis (Z axis) together with the carrier 300, and the coil 420 may be fixed to the housing 120. In the examples disclosed herein, the positions of the magnet 410 and the coil 420 may be exchanged with each other.

When a driving signal is applied to the coil 420, the carrier 300 may move in the direction of the optical axis (Z axis) due to electromagnetic interaction between the magnet 410 and the coil 420.

The lens barrel 210 may be accommodated in the carrier 300, and the lens barrel 210 may also move in the direction of the optical axis (Z axis) as the carrier 300 moves. A frame 310 and a lens holder 320 may also be accommodated in the carrier 300, and the frame 310, the lens holder 320, and the lens barrel 210 may move in the direction of the optical axis (Z axis) together as the carrier 300 moves.

When the carrier 300 moves, a rolling member B1 may be disposed between the carrier 300 and the housing 120 to reduce fraction between the carrier 300 and the housing 120. The rolling member B1 may have a form of a ball. The rolling member B1 may be disposed on each of both sides of the magnet 410.

A yoke 440 may be disposed in the housing 120. As an example, the yoke 440 may be mounted on the substrate 600 and may be disposed in the housing 120. The yoke 440 may be arranged on the other surface of the substrate 600. Accordingly, the yoke 440 may oppose the magnet 410 with the coil 420 interposed therebetween. Attractive force may work between the yoke 440 and the magnet 410 in a direction perpendicular to the optical axis (Z axis). By the attractive force between the yoke 440 and the magnet 410, the rolling member B1 may maintain a contact state with the carrier 300 and the housing 120. Also, the yoke 440 may collect magnetic force of the magnet 410 and may prevent leakage flux. As an example, the yoke 440 and the magnet 410 may form a magnetic circuit.

In the examples disclosed herein, in the process of adjusting a focus, a closed-loop control method of sensing a position of the lens barrel 210 and providing a feedback may be used. Accordingly, the focus adjusting unit may include a position detecting device for the closed-loop control. As an example, the position detecting device may include an autofocus (AF) hall device 430. A flux value detected from the AF hall device 430 may change in accordance with the movement of the magnet 410 opposing the AF hall device 430. The position detecting device may detect a position of the lens barrel 210 from changes in flux value of the AF hall device 430 caused by the movement of the magnet 410 in the direction of the optical axis (Z axis).

The shake correction unit 500 may be used to correct the blurring of an image or the shaking of a video caused by a factor such as shaking of a user's hand when an image or a video is obtained. For example, when the image shakes due to the shaking of a user's hand while an image is obtained, the shake correction unit 500 may provide a relative displacement corresponding the shaking to the lens barrel 210 to correct the shaking. As an example, the shake correction unit 500 may correct the shaking by moving the lens barrel 210 in directions perpendicular to the optical axis (Z axis).

The shake correction unit 500 may include a plurality of magnets 510a and 520a generating driving force for moving a guiding member in directions perpendicular to the optical axis (Z axis) and a plurality of coils 510b and 520b. The frame 310 and the lens holder 320 may be inserted into the carrier 300 and may be disposed in the optical axis (Z axis), and may guide the movement of the lens barrel 210. The frame 310 and the lens holder 320 may include a space into which the lens barrel 210 is inserted. The lens barrel 210 may be inserted into and fixed to the lens holder 320.

The frame 310 and the lens holder 320 may move in directions perpendicular to the optical axis (Z axis) with respect to the carrier 300 by driving force generated by magnetic interaction between the plurality of magnets 510a and 520a and the plurality of coils 510b and 520b. Among the plurality of magnets 510a and 520a and the plurality of coils 510b and 520b, the first magnetic 510a may be disposed on the second surface of the lens holder 320, and the first coil 510b may be disposed on the second surface of the substrate 600 such that the first magnetic 510a and the first coil 510b may generate driving force in a direction of a first axis (Y axis) perpendicular to the optical axis (Z axis). Also, the second magnet 520a may be disposed on a third surface of the lens holder 320 and the second coil 520b may be disposed on a third surface of the substrate 600, and the second magnet 520a and the second coil 520b may generate driving force in a direction of a second axis (X axis) perpendicular to the first axis (Y axis). The second axis (X axis) may refer to an axis perpendicular to both of the optical axis (Z axis) and the first axis (Y axis). The plurality of coils 510b and 520b may be configured to be orthogonal to each other on a planar surface perpendicular to the optical axis (Z axis).

The plurality of magnets 510a and 520a may be mounted on the lens holder 320, and the plurality of coils 510b and 520b opposing the plurality of magnets 510a and 520a may be disposed on the substrate 600 and may be mounted on the housing 120.

The plurality of magnets 510a and 520a may move in directions perpendicular to the optical axis (Z axis) along with the lens holder 320, and the plurality of coils 510b and 520b may be fixed to the housing 120. In the examples described herein, positions of the plurality of magnets 510a and 520a and the plurality of coils 510b and 520b may be changed with each other. For example, the plurality of coils 510b and 520b may be mounted on the lens holder 320 and may move in directions perpendicular to the optical axis (Z axis) along with the lens holder 320, and the plurality of magnets 510a and 520a opposing the plurality of coils 510b and 520b may be fixed to the housing 120.

In the examples disclosed herein, in the process of shake correction, a closed-loop control method of sensing a position of the lens barrel 210 and providing a feedback may be used. Accordingly, the shake correction unit 500 may include a position detecting device for the closed-loop control. The position detecting device may include optical image stabilization (OIS) hall devices 510c and 520c. The OIS hall devices 510c and 520c may be disposed on the substrate 600, and may be mounted on the housing 120. The OIS hall devices 510c and 520c may oppose the plurality of magnets 510a and 520a in directions perpendicular to the optical axis (Z axis). As an example, the first OIS hall device 510c may be disposed on the second surface of the substrate 600, and the second OIS hall device 520c may be disposed on the third surface of the substrate 600.

Flux values of the OIS hall devices 510c and 520c may change in accordance with the movement of the magnets 510a and 520a opposing the OIS hall devices 510c and 520c. The position detecting device may detect a position of the lens barrel 210 from changes in flux values of the OIS hall devices 510c and 520c caused by the movement of the magnets 510a and 520a in two directions (directions of X axis and Y axis) perpendicular to the optical axis.

The camera module 100 may include a plurality of ball members supporting the shake correction unit 500. The plurality of ball members may be configured to guide the movements of the frame 310, the lens holder 320, and the lens barrel 210, and also to maintain gaps among the carrier 300, the frame 310, and the lens holder 320.

The plurality of ball members may include a first ball member B2 and a second ball member B3. The first ball member B2 may guide the movements of the frame 310, the lens holder 320, and the lens barrel 210 in the direction of the first axis (Y axis), and the second ball member B3 may guide the movements of the lens holder 320 and the lens barrel 210 in the direction of the second axis (X axis).

As an example, when driving force working in the direction of the first axis (Y axis) occurs, the first ball member B2 may roll in the direction of the first axis (Y axis). Accordingly, the first ball member B2 may guide the movements of the frame 310, the lens holder 320, and the lens barrel 210 in the direction of the first axis (Y axis). Also, when driving force working in the direction of the second axis (X axis) occurs, the second ball member B3 may roll in the direction of the second axis (X axis). Accordingly, the second ball member B3 may guide the movements of the lens holder 320 and the lens barrel 210 in the direction of the second axis (X axis).

The first ball member B2 may include a plurality of ball members disposed between the carrier 300 and the frame 310, and the second ball member B3 may include a plurality of ball members disposed between the frame 310 and the lens holder 320.

A first guide groove portion 301 for accommodating the first ball member B2 may be disposed on each of surfaces of the carrier 300 and the frame 310 opposing in the direction of the optical axis (Z axis). The first guide groove portion 301 may include a plurality of guide grooves corresponding to the plurality of ball members of the first ball member B2. The first ball member B2 may be accommodated in the first guide groove portion 301 and may be interposed between the carrier 300 and the frame 310. The movement of the first ball member B2 may be prevented in the directions of the optical axis (Z axis) and the second axis (X axis) while the first ball member B2 is accommodated in the first guide groove portion 301, and may move only in the direction of the first axis (Y axis). As an example, the first ball member B2 may only roll in the direction of the first axis (Y axis). To this end, a planar surface of each of the plurality of guide grooves of the first guide groove portion 301 may have a rectangular shape having a length in the direction of the first axis (Y axis).

A second guide groove portion 311 for accommodating the second ball member B3 may be formed on each of surfaces of the frame 310 and the lens holder 320 opposing each other in the direction of the optical axis (Z axis). The second guide groove portion 311 may include a plurality of guide grooves corresponding to the plurality of ball members of the second ball member B3.

The second ball member B3 may be accommodated in the second guide groove portion 311 and may be interposed between the frame 310 and the lens holder 320. The movement of the second ball member B3 in the directions of the optical axis (Z axis) and the first axis (Y axis) may be prevented while the second ball member B3 is accommodated in the second guide groove portion 311, and may only move in the direction of the second axis (X axis). As an example, the second ball member B3 may only roll in the direction of the second axis (X axis). To this end, a planar surface of each of the plurality of guide grooves of the second guide groove portion 311 may have a rectangular shape having a length in the direction of the second axis (X axis).

A third ball member B4 for supporting the movement of the lens holder 320 between the carrier 300 and the lens holder 320 may be provided. The third ball member B4 may guide the movements of the lens holder 320 in the directions of the first axis (Y axis) and the second axis (X axis).

As an example, the third ball member B4 may roll in the direction of the first axis (Y axis) when driving force occurs in the direction of the first axis (Y axis). Accordingly, the third ball member B4 may guide the movement of the lens holder 320 in the direction of the first axis (Y axis).

Also, the third ball member B4 may roll in the second axis (X axis) when driving force occurs in the direction of the second axis (X axis). Accordingly, the third ball member B4 may guide the movement of the lens holder 320 in the second axis (X axis). The second ball member B3 and the third ball member B4 may be in contact with and may support the lens holder 320.

A third guide groove portion 302 for accommodating the third ball member B4 may be formed on each of surfaces of the carrier 300 and the lens holder 320 opposing each other in the direction of the optical axis (Z axis). The third ball member B4 may be accommodated in the third guide groove portion 302 and may be interposed between the carrier 300 and the lens holder 320. The movement of the third ball member B4 in the direction of the optical axis (Z axis) may be prevented while the third ball member B4 is accommodated in the third guide groove portion 302, and may roll only in the directions of the first axis (Y axis) and the second axis (X axis). To this end, a planar surface of the third guide groove portion 302 may have a circular shape. Thus, the planar surfaces of the first guide groove portion 301, the second guide groove portion 311, and the third guide groove portion 302 may have different shapes.

The first ball member B2 may roll in the direction of the first axis (Y axis), the second ball member B3 may roll in the direction of the second axis (X axis), and the third ball member B4 may roll in the directions of the first axis (Y axis) and the second axis (X axis).

When driving force working in the direction of the first axis (Y axis) occurs, the frame 310, the lens holder 320, and the lens barrel 210 may move in the direction of the first axis (Y axis). The first ball member B2 and the third ball member B4 may roll in the direction of the first axis (Y axis). The movement of the second ball member B3 in the direction of the first axis (Y axis) may be prevented.

When driving force working in the direction of the second axis (X axis) occurs, the lens holder 320 and the lens barrel 210 may move in the direction of the second axis (X axis). The second ball member B3 and the third ball member B4 may roll in the direction of the second axis (X axis). The movement of the first ball member B2 in the direction of the second axis (X axis) may be prevented.

In the examples disclosed herein, a plurality of yokes 510d and 520d may be provided such that the shake correction unit 500 and the first to third ball members B2, B3, and B4 may maintain a contact state therebetween. The plurality of yokes 510d and 520d may be fixed to the carrier 300, and may oppose the plurality of magnets 510a and 520a in the direction of the optical axis (Z axis). Accordingly, attractive force may occur between the plurality of yokes 510d and 520d and the plurality of magnets 510a and 520a. By the attractive force between the plurality of yokes 510d and 520d and the plurality of magnets 510a and 520a, the shake correction unit 500 may be pressured in a direction of the plurality of yokes 510d and 520d, and accordingly, the frame 310 and the lens holder 320 of the shake correction unit 500 may maintain a contact state with the first to third ball members B2, B3, and B4. The plurality of yokes 510d and 520d may be formed of a material which may generate attractive force between the plurality of yokes 510d and 520d and the plurality of magnets 510a and 520a. As an example, the plurality of yokes 510d and 520d may be formed of a magnetic material.

In the examples disclosed herein, the plurality of yokes 510d and 520d may be provided such that the frame 310 and the lens holder 320 may maintain a contact state with the first to third ball members B2, B3, and B4, and a stopper 330 may be provided to prevent the first to third ball members B2, B3, and B4, the frame 310, and the lens holder 320 from being detached from the carrier 300. The stopper 330 may be coupled to the carrier 300 to cover at least a portion of an upper surface of the lens holder 320.

The aperture module 800 may include an aperture 810, a magnet 820, a coil 830, a hall device 840, and a substrate 850.

The aperture 810 of the aperture module 800 may be coupled to the lens barrel 210 through an upper portion of the case 110. As an example, the aperture 810 may be mounted on the lens holder 320 to which the lens barrel 210 is fixedly inserted, and may be coupled to the lens barrel 210. Accordingly, the aperture 810 may move along with the lens barrel 210 and the lens holder 320.

The magnet 820 may be arranged on one side of the aperture 810. As an example, the magnet 820 may be mounted on the substrate 850 arranged on one side of the aperture 810 and may be disposed on one side of the aperture 810. The magnet 820 may be arranged on one side of the aperture 810 and may be disposed on the fourth surface of the lens holder 320. As an example, the magnet 820 may include two magnetic materials polarized from each other.

The substrate 850 may be coupled to the aperture 810 to move in the direction of the second axis (X axis). The substrate 850 may include a connection member which may be inserted into the aperture 810 and may move in the direction of the second axis (X axis) such that the substrate 850 may be coupled to the aperture 810 to move in the direction of the second axis (X axis). A diameter of an incident hole of an upper portion of the aperture 810 may change according to a degree of insertion of the connection member of the substrate 850, that is, a length of the substrate 850 and the aperture 810 in the direction of the second axis (X axis) such that an amount of light incident through the aperture 810 may be determined.

The coil 830 may be disposed on the fourth surface of the substrate 600 to oppose the magnet 820. The coil 830 may be disposed on the fourth surface of the substrate 600 and may generate driving force in the direction of the first axis (Y axis). When driving force occurs in the direction of the first axis (Y axis) by the magnet 820 and the coil 830, distances of the magnet 820 and the coil 830 taken in the direction of the first axis (Y axis) may change.

The hall device 840 may oppose the magnet 820 on the fourth surface of the substrate 600. The hall device 840 may include a first hall device 841 and a second hall device 842 disposed with the coil 830 interposed therebetween. A flux value of the hall device 840 may change according to the movement of the magnet 820. A position of the magnet 820 may be detected from a flux value of the hall device 840.

Figure 3:
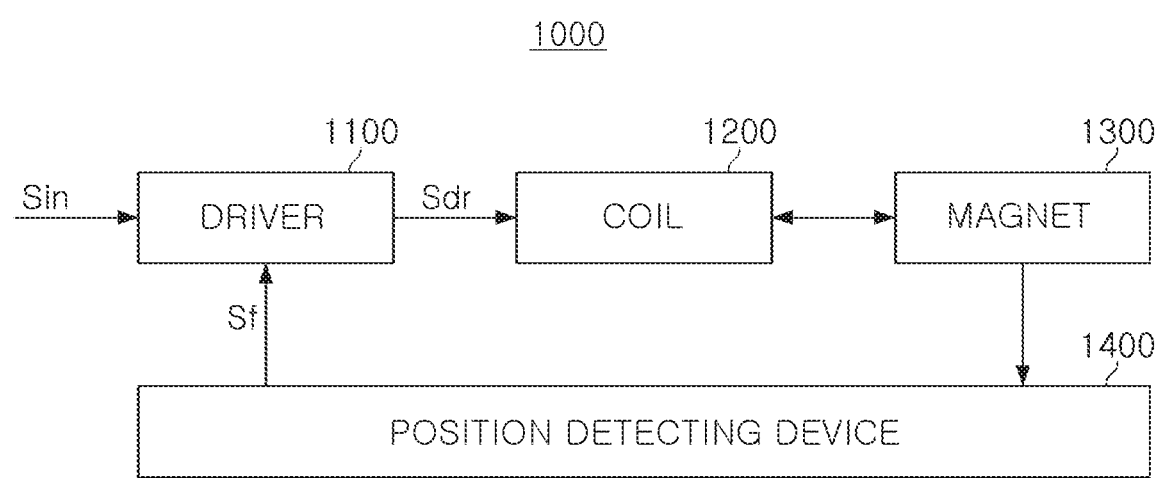
FIG. 3 is a block diagram illustrating an aperture module employed in a camera module according to one or more examples of the present disclosure.

FIG. 3 is a block diagram illustrating an aperture module employed in a camera module according to one or more examples. An aperture module 1000 in an example illustrated in FIG. 3 may correspond to the aperture module 800 illustrated in FIG. 2.

The aperture module 1000 in the examples disclosed herein may include a driver 1100, a coil 1200, a magnet 1300, and a position detecting device 1400.

The driver 1100 may generate a driving signal Sdr according to an input signal Sin applied from an external element, such as a circuit or processor, or the like, and a feedback signal Sf generated by the position detecting device 1400, and may provide the generated driving signal Sdr to the coil 1200. The input signal Sin may include information on a target position of the magnet 1300 corresponding to external illumination information of a camera module. An amount of light incident through an aperture may be determined according to a target position of the magnet 1300. As an example, the input signal Sin may be provided from an image processor which performs an image processing of an image signal generated by the image sensor. As another example, the input signal Sin may be provided from an illumination sensor arranged in a camera module.

When the driving signal Sdr provided from the driver 1100 is applied to the coil 1200, a diameter of an aperture may be determined by electromagnetic interaction between the coil 1200 and the magnet 1300.

The position detecting device 1400 may detect a position of the magnet 1300 moving by electromagnetic interaction between the coil 1200 and the magnet 1300 and may generate the feedback signal Sf, and may provide the feedback signal Sf to the driver 1100. As an example, the position detecting device 1400 may include a hall device for detecting a flux value.

When the feedback signal Sf is provided to the driver 1100, the driver 1100 may compare the input signal Sin with the feedback signal Sf and may generate the driving signal Sdr again. Accordingly, the driver 1100 may be driven based on a closed-loop type control to compare the input signal Sin with the feedback signal Sf. The closed-loop type driver 1100 may be driven in a direction of reducing an error between a target position of the magnet 1300 included in the input signal Sin and a current position of the magnet 1300 included in the feedback signal Sf. The driving based on the closed-loop method may have improved linearity, accuracy, and repeatability as compared to an open-loop method.

Figure 4:
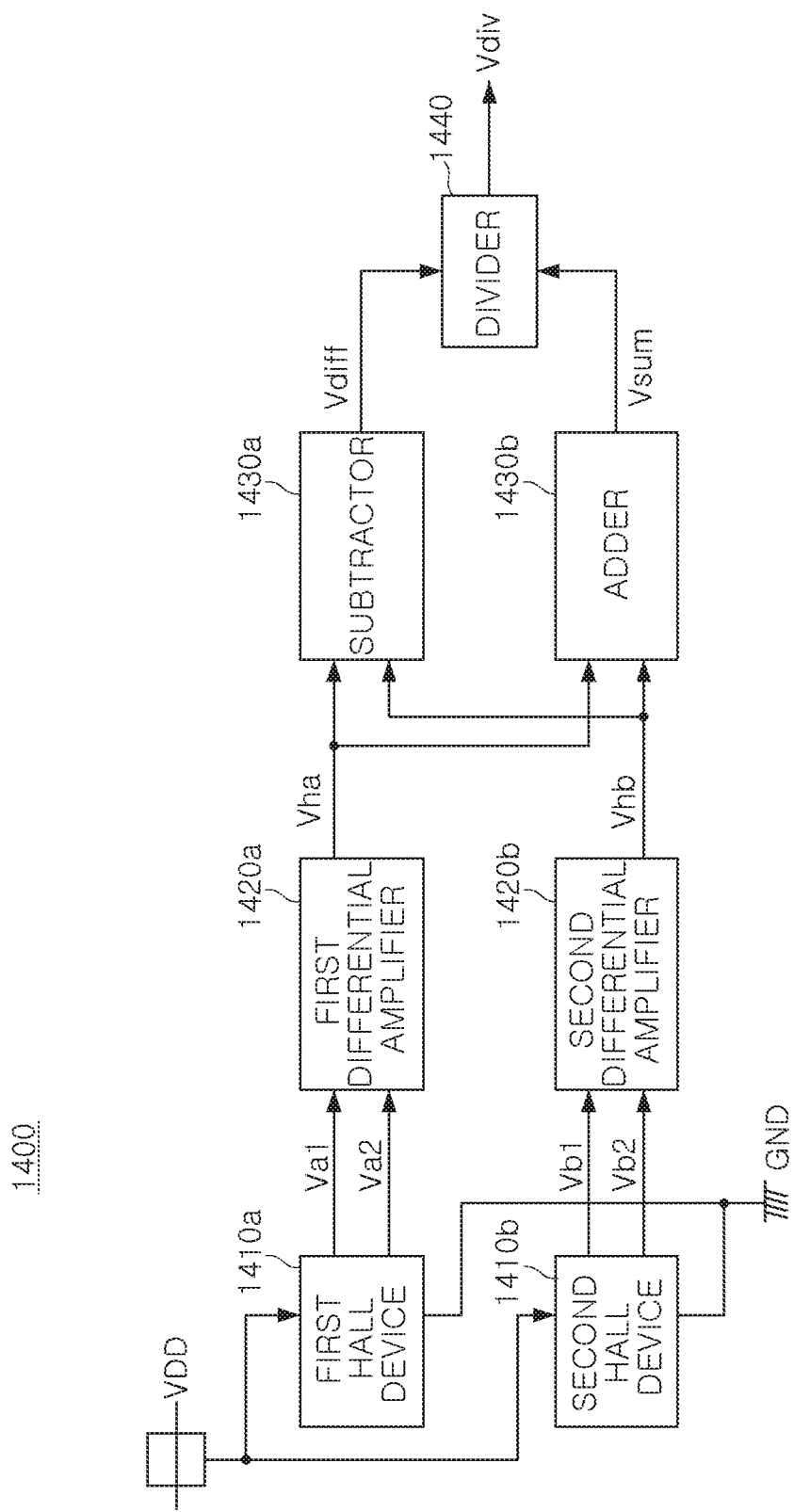
FIG. 4 is a block diagram illustrating a position detecting device according to one or more examples of the present disclosure.

FIG. 4 is a block diagram illustrating a position detecting device according to one or more examples.

Referring to FIG. 4, a position detecting device 1400 in the examples disclosed herein may include a first hall device 1410a, a second hall device 1410b, a first differential amplifier 1420a, a second differential amplifier 1420b, a subtractor 1430a, an adder 1430b, and a divider 1440.

When a driving voltage VDD is applied to the first hall device 1410a, the first hall device 1410a may output two output voltages Va1 and Va2. The first differential amplifier 1420a may differential-amplify the two output voltages Va1 and Va2 output by the first hall device 1410a and may generate a first hall voltage Vha (Vha=Va1−Va2). Similarly, when a driving voltage VDD is applied to the second hall device 1410b, the second hall device 1410b may output two output voltages Vb1 and Vb2. The second differential amplifier 1420b may differential-amplify the two output voltages Vb1 and Vb2 output from the second hall device 1410b and may generate a second hall voltage Vhb (Vhb=Vb1−Vb2).

As an example, the first hall voltage Vha and the second hall voltage Vhb may have the same tendency with respect to different magnetic materials having different polarities. For example, the first hall voltage Vha may increase when a magnetic material having a first polarity moves in one direction, and the first hall voltage Vha may decrease when the magnetic material having the first polarity moves in a direction different from the one direction. The second hall voltage Vhb may increase when a magnetic material having a second polarity different from the first polarity moves in the one direction, and the second hall voltage Vhb may decrease when the magnetic material having the second polarity moves in the direction different from the one direction.

The subtractor 1430a may subtract the first hall voltage Vha and the second hall voltage Vhb and may output a subtraction voltage Vdiff (Vdiff=Vha−Vhb), and the adder 1430b may add the first hall voltage Vha and the second hall voltage Vhb and may output an addition voltage Vsum (Vsum=Vha+Vhb). The subtractor 1430a and the adder 1430b may be hardware, such as circuitry, for example, one or more circuits, one or more circuit components, and/or one or more other hardware components.

The divider 1440 may output a division voltage Vdiv (Vdiv=Vsum/Vdiff) according to a ratio of the subtraction voltage Vdiff to the addition voltage Vsum. The divider 1440 may be hardware, such as circuitry, for example, one or more circuits, one or more circuit components, and/or one or more other hardware components. When the first hall voltage Vha of the first hall device 1410a and the second hall voltage Vhb of the second hall device 1410b are affected by a temperature coefficient T, the division voltage Vdiv may be represented by Equation 1 as below:

$$Vdiv = \frac{T*Vha + T*Vhb}{T*Vha - T*Vhb} \quad \text{Equation 1}$$

Referring to Equation 1, even when the first hall voltage Vha and the second hall voltage Vhb are affected by a temperature coefficient T, the temperature coefficient T may be erased according to a ratio of the subtraction voltage Vdiff to the addition voltage Vsum. Accordingly, in the examples described herein, the position detecting device 1400 may provide the division voltage Vdiv determined according to a ratio of the subtraction voltage Vdiff to the addition voltage Vsum as the feedback signal Sf, and may remove changes in hall voltage according to changes in temperature.

To accurately detect a position of the magnet 1300, the addition voltage Vsum corresponding to a numerator of the division voltage Vdiv may need to be changed linearly according to the movement of the magnet 1300, and the subtraction voltage Vdiff corresponding to a denominator of the division voltage Vdiv may need to be constant according to the movement of the magnet 1300.

Figure 5:
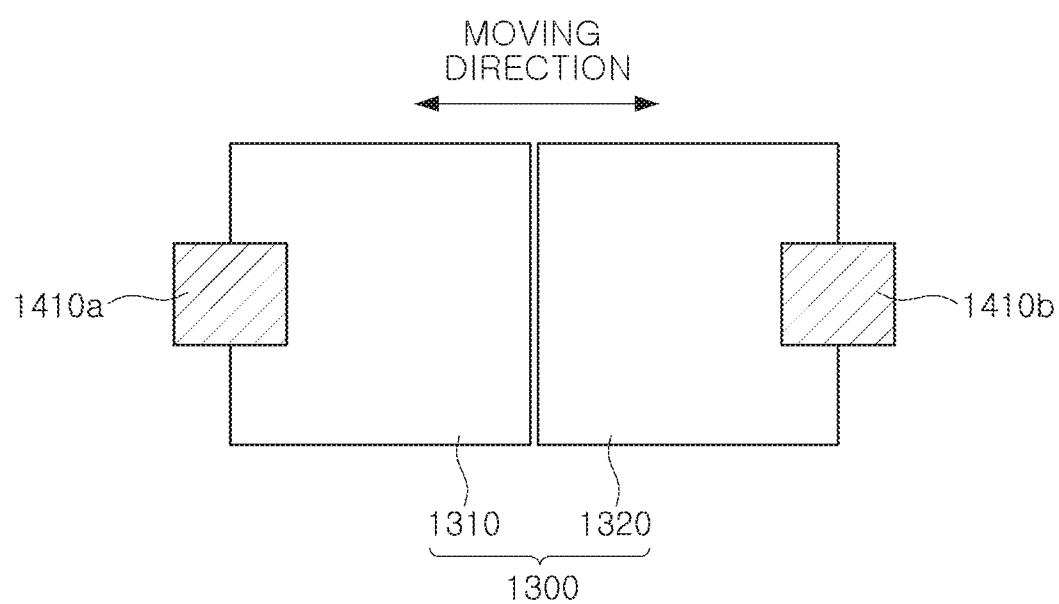
FIG. 5 is a diagram illustrating an arrangement of a magnet, a first hall device, and a second hall device according to one or more examples of the present disclosure.
Figure 6A:
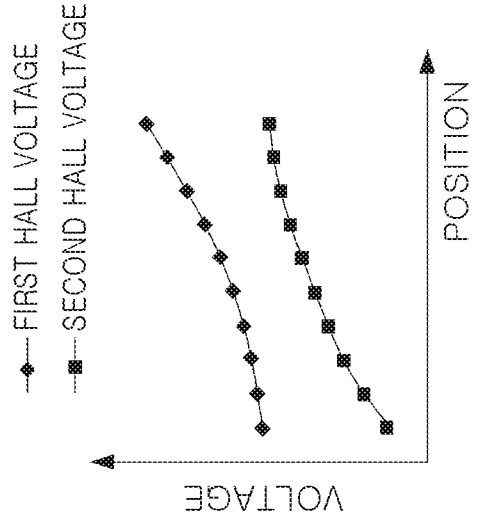
FIG. 6A, FIG. 6B, and FIG. 6C are graphs illustrating output voltages of main elements illustrated in FIG. 4 according to movement of a magnet.
Figure 6B:
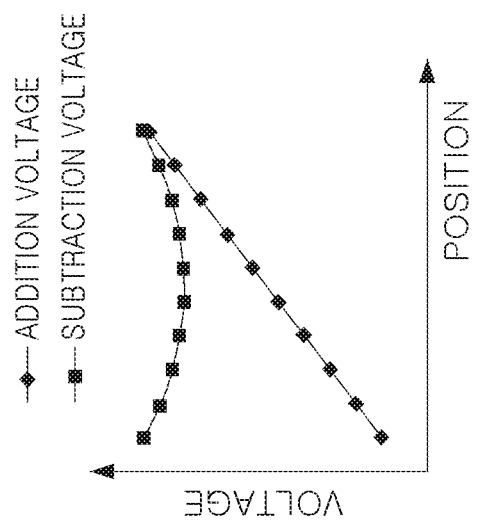
Figure 6C:
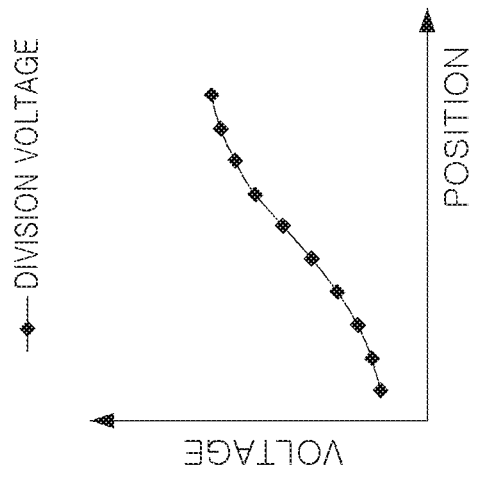

FIG. 5 is a diagram illustrating an arrangement of a magnet, a first hall device, and a second hall device according to one or more examples. FIG. 6A, FIG. 6B and FIG. 6C are graphs illustrating output voltages of main elements illustrated in FIG. 4 according to movement of a magnet.

Referring to FIG. 5, the magnet 1300 may include a first magnetic material 1310 and a second magnetic material 1320 having different polarities. The magnet 1300 may move in one direction by electromagnetic interaction with a coil. As an example, the magnet 1300 may move in a direction in which the first magnetic material 1310 and the second magnetic material 1320 are disposed.

The first hall device 1410a and the second hall device 1410b may be disposed in a direction of movement of the magnet 1300. The first hall device 1410a may be disposed to correspond to the first magnetic material 1310, and the second hall device 1410b may be disposed to correspond to the second magnetic material 1320. As an example, the first hall device 1410a may be disposed to correspond to an edge region of the first magnetic material 1310, and the second hall device 1410b may be disposed to correspond to an edge region of the second magnetic material 1320.

FIG. 6A is a graph illustrating a first hall voltage and a second hall voltage according to an example. FIG. 6B is a graph illustrating an addition voltage and a subtraction voltage according to an example. FIG. 6C is a graph illustrating a division voltage according to an example.

Referring to FIG. 6A, when a magnet 1300 moves to a side of a first hall device 1410a in accordance with arrangement of the magnet 1300, the first hall device 1410a, and a second hall device 1410b, an amount of change in first hall voltage Vha may be less than an amount of change in second hall voltage Vhb. When the magnet 1300 moves to a side of the second hall device 1410b, an amount of change in the first hall voltage Vha may be greater than an amount of change in the second hall voltage Vhb.

Referring to FIG. 6B, an addition voltage Vsum may have linearity with respect to the movement of the magnet 1300. A level of subtraction voltage Vdiff may decrease when the magnet 1300 moves to a neutral position from the side of the first hall device 1410a, and when the magnet 1300 moves to a side of the second hall device 1410b from the neutral position, a level of the subtraction voltage Vdiff may increase. Thus, a level of the subtraction voltage Vdiff may not be constant with respect to the movement of the magnet 1300.

Referring to FIG. 6C, as the subtraction voltage Vdiff is not constant with respect to the movement of the magnet 1300, the division voltage Vdiv generated based on the subtraction voltage Vdiff may not have linearity with respect to a position of the magnet 1300.

Figure 7:
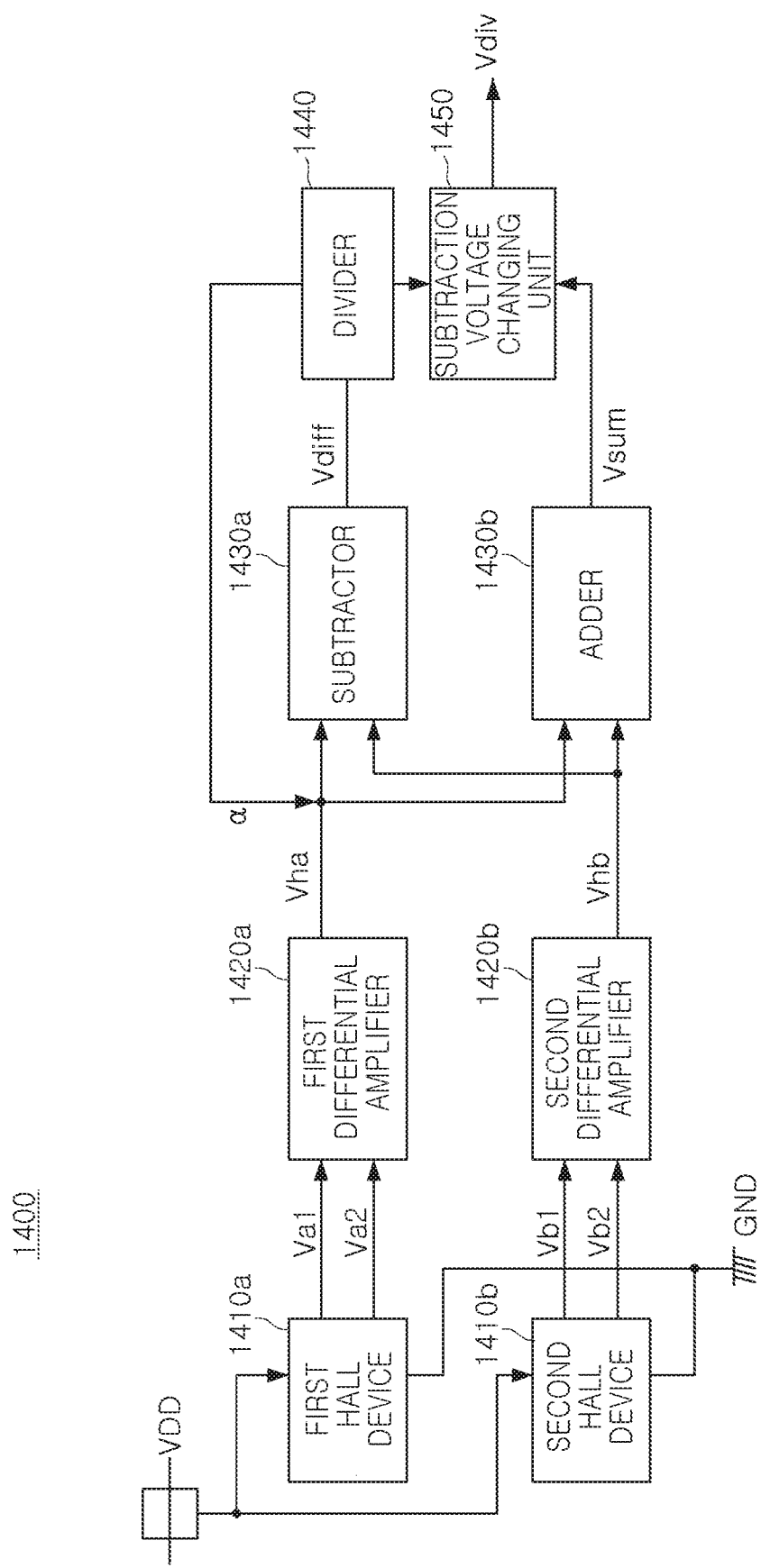
FIG. 7 is a block diagram illustrating a position detecting device according to one or more examples of the present disclosure.

FIG. 7 is a block diagram illustrating a position detecting device according to one or more examples. The block diagram of the position detecting device illustrated in FIG. 7 may be similar to the block diagram of the position detecting device illustrated in FIG. 4, and thus, overlapping descriptions may not be further provided, and differences may mainly be described.

Referring to FIG. 7, a position detecting device 1400 in the examples described herein may further include a subtraction voltage changing unit 1450. The subtraction voltage changing unit 1450 may be hardware, such as circuitry, for example, one or more circuits, one or more circuit components, and/or one or more other hardware components.

The subtraction voltage changing unit 1450 in the present example illustrated in FIG. 7 may compensate for non-linearity of a division voltage Vdiv when a magnet 1300 operates in two steps.

When the magnet 1300 moves in two steps, the magnet 1300 may move over a first target point (a point where a diameter of an aperture is maximum) and a second target point (a point where a diameter of an aperture is minimum) in steps. The moving in steps indicates that the magnet 1300 may be positioned in the first target point and the second target point to adjust a diameter of an aperture in two steps, and that a transition section between the first target point and the second target point may not be determined as a target position.

The subtraction voltage changing unit 1450 in the present examples illustrated in FIG. 7 may maintain the subtraction voltage Vdiff at the first target point and the second target point and in the transition section between the first target point and the second target point to be constant and may compensate for non-linearity of the division voltage Vdiv.

The subtraction voltage changing unit 1450 may change the subtraction voltage Vdiff of the transition section between the first target point and the second target point to a subtraction voltage Vdiff obtained at a target point before the transition section.

As an example, when the magnet 1300 moves from the first target point to the second target point, the subtraction voltage changing unit 1450 may change the subtraction voltage Vdiff in the transition section between the first target point and the second target point to a subtraction voltage Vdiff of the first target point. Accordingly, the subtraction voltage Vdiff at the first target point and the subtraction voltage Vdiff at the transition section may be determined to be the same value.

When the subtraction voltage Vdiff in the transition section is different from the subtraction voltage Vdiff at the second target point, the division voltage Vdiv may rapidly change. Thus, it may be necessary to set the subtraction voltage Vdiff in the transition section to be the same as the subtraction voltage Vdiff at the second target point.

The subtraction voltage changing unit 1450 may apply a correction coefficient to one of the first hall voltage Vha and the second hall voltage Vhb and may set the subtraction voltage Vdiff at the first target point to be the same as the subtraction voltage Vdiff at the second target point. Accordingly, the subtraction voltage Vdiff at the first target point, the subtraction voltage Vdiff at the transition section, and the subtraction voltage Vdiff at the second target point may be the same.

The subtraction voltage changing unit 1450 may apply a correction coefficient to one of the first hall voltage Vha and the second hall voltage Vhb and may correct one of the first hall voltage Vha and the second hall voltage Vhb.

In the description below, it may be assumed that the subtraction voltage changing unit 1450 may apply a correction coefficient to the first hall voltage Vha and may correct the first hall voltage. The description below may also be applied to the correction of the second hall voltage Vhb.

The subtraction voltage changing unit 1450 may apply correction coefficient $\alpha$ to the first hall voltage Vha and may correct the first hall voltage Vha. The correction coefficient $\alpha$ may be represented by Equation 2 as below. In Equation 2, "Vhamax" may be the first hall voltage of when the magnet is disposed at the first target point, "Vhamin" may be the first hall voltage of when the magnet is disposed at the second target point, "Vhbmax" may be the second hall voltage of when the magnet is disposed at the first target point, and "Vhbmin" may be the second hall voltage of when the magnet is disposed at the second target point.

$$\alpha = \frac{Vhb\text{max} - Vhb\text{min}}{Vha\text{max} - Vha\text{min}} \qquad \text{Equation 2}$$

When the correction coefficient $\alpha$ is applied to the first hall voltage Vha, the subtraction voltage Vdiffmax of when the magnet 1300 is disposed at the first target point may be represented by Equation 3 as below:

$$\begin{aligned} Vdiff\text{max} &= Vha\text{max} * \frac{Vhb\text{max} - Vhb\text{min}}{Vha\text{max} - Vha\text{min}} - Vhb\text{max} \\ &= \frac{Vha\text{min} * Vhb\text{max} - Vha\text{max} * Vhb\text{min}}{Vha\text{max} - Vha\text{min}} \end{aligned} \qquad \text{Equation 3}$$

Also, when the correction coefficient $\alpha$ is applied to the first hall voltage Vha, and the magnet is disposed at the second target point, the subtraction voltage Vdiffmin may be represented by Equation 4 as below:

$$\begin{aligned} Vdiff\text{min} &= Vha\text{min} * \frac{Vhb\text{max} - Vhb\text{min}}{Vha\text{max} - Vha\text{min}} - Vhb\text{min} \\ &= \frac{Vha\text{min} * Vhb\text{max} - Vha\text{max} * Vhb\text{min}}{Vha\text{max} - Vha\text{min}} \end{aligned} \qquad \text{Equation 4}$$

Referring to Equations 3 and 4, when the correction coefficient $\alpha$ is applied to the first hall voltage Vha, the subtraction voltage Vdiffmax at the first target point, the subtraction voltage Vdiff in the transition section, and the subtraction voltage Vdiffmin at the second target point may be determined to be the same such that the division voltage Vdiv may have linearity with respect to a position of the magnet 1300.

Figure 8:
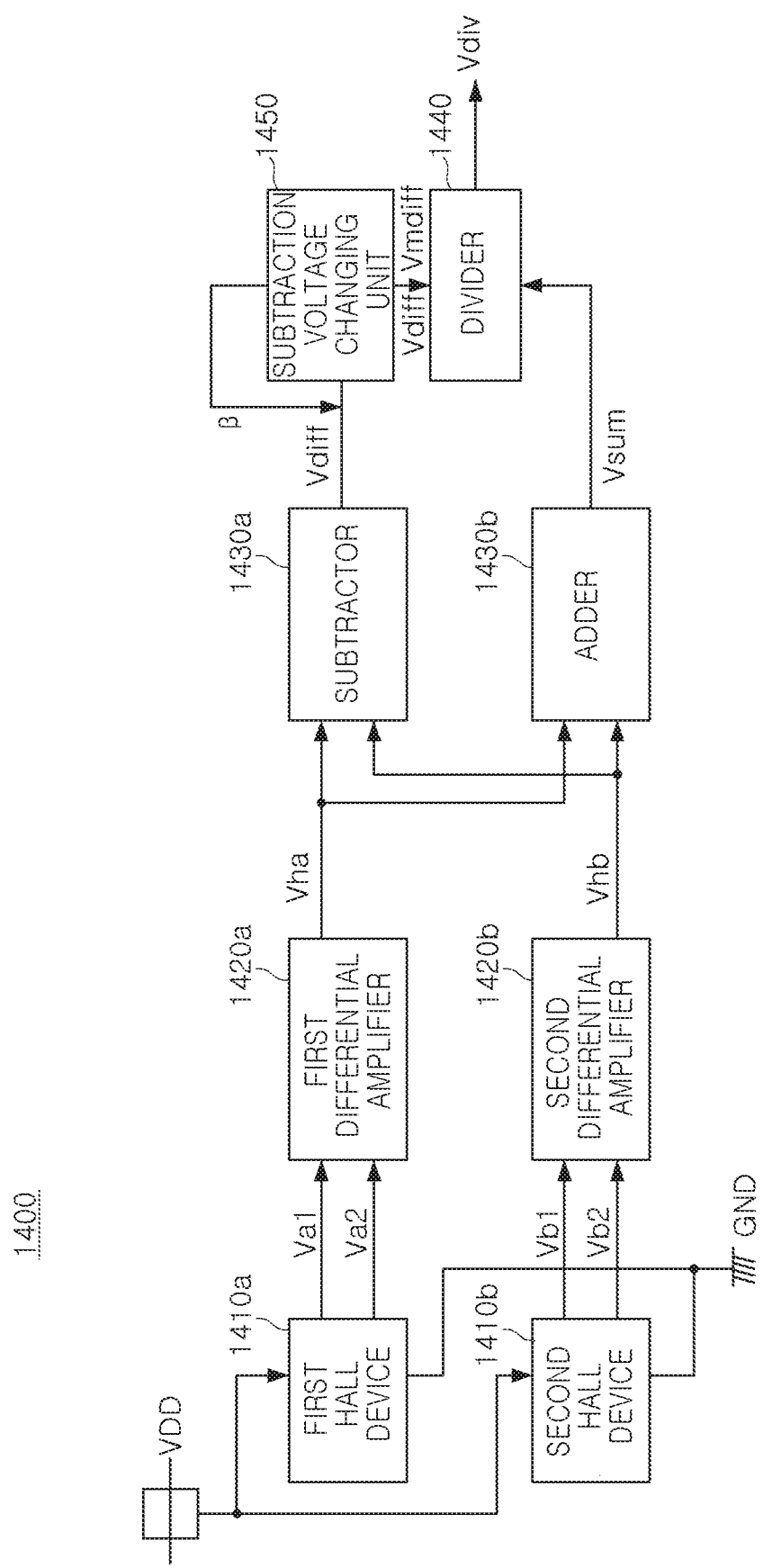
FIG. 8 is a block diagram illustrating a position detecting device according to one or more examples of the present disclosure.

FIG. 8 is a block diagram illustrating a position detecting device according to one or more examples. The block diagram of the position detecting device illustrated in FIG. 8 may be similar to the block diagram of the position detecting device illustrated in FIG. 4, and thus, overlapping descriptions may not be further provided, and mainly differences may be described.

Referring to FIG. 8, a position detecting device 1400 in the examples described herein may further include a subtraction voltage changing unit 1450.

The subtraction voltage changing unit 1450 in the present examples illustrated in FIG. 8 may compensate for non-linearity of a division voltage Vdiv when a magnet 1300 operates in three or more steps.

As an example, when the magnet 1300 moves in three steps, the magnet 1300 may move over a first target point (a point where a diameter of an aperture is maximum), a second target point (a target point between a first target point and a third target point), and a third target point (a point where a diameter of an aperture is minimum) in steps. The moving in steps indicates that the magnet 1300 may be positioned at the first target point, the second target point, and the third target point to adjust a diameter of an aperture in three steps, and that a transition section between the first target point and the second target point, the second target point, and the third target point may not be determined as target positions.

When the magnet 1300 moves in three or more steps, the subtraction voltage changing unit 1450 in the present examples illustrated in FIG. 8 may maintain the subtraction voltages of the two target points and of a transition section between two adjacent target points to be constant such that the subtraction voltage changing unit 1450 may compensate for non-linearity of the division voltage Vdiv.

The subtraction voltage changing unit 1450 may change the subtraction voltage Vdiff of the transition section to a subtraction voltage Vdiff lastly obtained at a target point before the transition section and may generate a correction subtraction voltage Vmdiff of the corresponding transition section. Thus, the correction subtraction voltage Vmdiff in the transition section may be the same as the subtraction voltage Vdiff lastly obtained at a target point before the transition section.

Also, the subtraction voltage changing unit 1450 may change the subtraction voltage Vdiff of the transition section to a correction subtraction voltage Vmdiff lastly obtained at a target point before the transition section and may generate the correction subtraction voltage Vmdiff of the corresponding point. Thus, the correction subtraction voltage Vmdiff in the transition section may be the same as the correction subtraction voltage Vmdiff lastly obtained at a target point before the transition section.

When the correction subtraction voltage Vmdiff in the transition section is the same as the subtraction voltage Vdiff lastly obtained at a target point before the transition section, the target point before the transition section may be an initial target point, and when the correction subtraction voltage Vmdiff in the transition section is the same as the correction subtraction voltage Vmdiff lastly obtained at a target point before the transition section, the target point before the transition section may not be an initial target point.

When the subtraction voltage Vdiff in the transition section is different from the subtraction voltage Vdiff at the target point after the transition section, the division voltage Vdiv may rapidly change. Thus, it may be necessary to set the subtraction voltage Vdiff in the transition section to be the same as the subtraction voltage Vdiff at the target point after the transition section.

The subtraction voltage changing unit 1450 may apply correction coefficient β to the subtraction voltage Vdiff obtained at a target point after the transition section, and may calculate the correction subtraction voltage Vmdiff. The correction coefficient β may include correction coefficients β1 and β2. The correction coefficient β1 may be applied when a target point before a current target point is an initial target point, and the correction coefficient β2 may be applied when a target point before a current target point is not an initial target point.

As an example, the correction coefficient β1 may be represented by Equation 5 as below. In Equation 5, "Vdiff present point_first" may refer to a subtraction voltage firstly obtained at a current target point, and "Vdiff before point_last" may refer to a subtraction voltage lastly obtained at a target point before the current target point (before the transition section).

$$\beta 1 = \frac{\text{Vdiff\_before point\_last}}{\text{Vdiff\_present point\_first}} \qquad \text{Equation 5}$$

As an example, the correction coefficient β2 may be represented by Equation 6 as below. In Equation 6, "Vdiff present point_first" may refer to a subtraction voltage firstly obtained at a current target point, and "Vmdiff before point" may refer to a subtraction voltage lastly obtained at a target point before the current target point.

$$\beta 2 = \frac{\text{Vmdiff\_before point\_last}}{\text{Vdiff\_present point\_first}} \qquad \text{Equation 6}$$

Table 1 below relates to a method of non-linear connection of the division voltage Vdiv according to an example. In the description below, a method of non-linear connection of the division voltage Vdiv will be described in detail.

TABLE 1

| Time (s) | Position | Temperature Coefficient | Vdiff | Vmdiff |
|---|---|---|---|---|
| T1 | 1 | 1.00 | 6650.00 | — |
| T2 | 1 | 1.01 | 6716.50 | — |
| T3 | 1 | 1.02 | 6783.00 | — |
| T4 | 2 | 1.02 | 5151.00 | 6783.00 |
| T5 | 3 | 1.02 | 3927.00 | 6783.00 |
| T6 | 3 | 1.03 | 3965.50 | 6849.50 |
| T7 | 3 | 1.04 | 4004.00 | 6916.00 |
| T8 | 4 | 1.04 | 3172.00 | 6916.00 |
| T9 | 5 | 1.04 | 2756.00 | 6916.00 |
| T10 | 6 | 1.05 | 2756.00 | 6916.00 |
| T11 | 6 | 1.05 | 2782.50 | 6982.50 |

In Table 1, it may be assumed that a position of the magnet 1300 may move from position 1 to position 6 as the time elapses to the time between T1 and T11. Positions 1, 3, and 6 are target points, and positions 2, 4, and 5 are transition sections.

Referring to Table 1, when the magnet moves from target point 1 to target point 3, a subtraction voltage (Vdiff=5151.00) in the transition section 2 may change to a subtraction voltage (Vdiff=6783.00) lastly obtained at the target point 1 before the transition section, and a correction subtraction voltage (Vmdiff=6783.00) in the transition section may be calculated.

When the magnet moves from the target point 3 to the target point 6, a subtraction voltage (Vdiff=3172.00) in the transition section 4 and a subtraction voltage (Vdiff=2756.00) in the transition section 5 may be changed to a correction subtraction voltage (Vdiff=4004.00) lastly obtained at the target point 3, and a correction subtraction voltage (Vmdiff=6916.00) in the transition section 4 and the transition section 5 may be calculated.

The correction coefficient β1 may be applied to each of the subtraction voltages (Vdiff=3927.00, 3965.50, 4004.00) sequentially obtained at the target point 3. Accordingly, β1(=6783.00/3927.00) may be applied to the subtraction voltage (Vdiff=3927.00) of the time point T5, and a correction subtraction voltage (Vmdiff=6783.00) at the target point 3 at the time point T5 may be calculated. Also, β1 (=6783.00/3927.00) may be applied to the subtraction voltage (Vdiff=3965.50) of time point T6, and a correction subtraction voltage (Vmdiff=6849.50) at the target point 3 at the time point T6 may be calculated. Also, β1(=6783.00/3927.00) may be applied to a subtraction voltage (Vdiff=4004.00) of time point T7, and a correction subtraction voltage (Vmdiff=6916.00) at the target point 3 at the time point T7 may be calculated.

Correction coefficient β2 may be applied to each of subtraction voltages (Vdiff=2756.00, 2782.50) sequentially obtained at the target point 6. Accordingly, the correction coefficient β2 (=6916.00/2756.00) may be applied to the subtraction voltage (Vdiff=2756.00) of time point T10, a correction subtraction voltage (Vmdiff=6916.00) at the target point 6 at the time point T10 may be calculated.

Thus, β2 (=6916.00/2756.00) may be applied to a subtraction voltage (Vdiff=2782.50) of time point T11, and a correction subtraction voltage (Vmdiff=6982.50) at the target point 6 of the time point T11 may be calculated.

According to the examples described herein, the position detecting device of the aperture module may compensate for changes in hall voltage caused by changes in temperature and may maintain linearity with respect to displacement of the aperture at the same time.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A position detecting device for detecting a position of a magnet configured to move over a first target point and a second target point in steps, the position detecting device comprising:
    a first hall device configured to generate a first hall voltage;
    a second hall device configured to generate a second hall voltage;
    a subtractor circuit configured to generate a subtraction voltage based on a difference between the first hall voltage and the second hall voltage;
    an adder circuit configured to generate an addition voltage based on a combination of the first hall voltage and the second hall voltage;
    a divider circuit configured to calculate a ratio of the subtraction voltage to the addition voltage; and
    a subtraction voltage changing unit circuit configured to maintain the subtraction voltage at the first target point and the second target point and in a transition section between the first target point and the second target point to be constant.

2. The position detecting device of claim 1, wherein the first hall device and the second hall device are disposed in a moving direction of the magnet.

3. The position detecting device of claim 1, wherein the subtraction voltage changing unit circuit is configured to change the subtraction voltage of the transition section to a subtraction voltage of a target point before the transition section, where the target point is the first target point or the second target point.

4. The position detecting device of claim 1, wherein the subtraction voltage changing unit circuit is configured to apply a correction coefficient to one of the first hall voltage and the second hall voltage.

5. The position detecting device of claim 4, wherein the subtraction voltage at the first target point and the subtraction voltage at the second target point are maintained to be the same by the correction coefficient.

6. The position detecting device of claim 4,
    wherein the correction coefficient is applied to the first hall voltage, and
    wherein the correction coefficient is calculated in accordance with a ratio of a difference between the first hall voltage at the first target point and the first hall voltage at the second target point to a difference between the second hall voltage at the first target point and the second hall voltage at the second target point.

7. The position detecting device of claim 1, further comprising:
    a differential amplifier configured to differential-amplify output voltages output by the first hall device to generate the first hall voltage, and to differential-amplify output voltages output by the second hall device to generate the second hall voltage.

8. An aperture module, comprising:
    a driver circuit configured to output a driving signal to a coil to move the magnet to the first target point, the second target point, and in the transition section, in response to an input signal and a feedback signal;
    an aperture configured to adjust an amount of light through the aperture in response to movement of the magnet; and
    the position detecting device of claim 1 configured to input the ratio of the subtraction voltage to the addition voltage as changed by the subtraction voltage changing unit to the driver circuit in the feedback signal.

9. A camera module, comprising:
    a lens barrel disposed in a housing;
    the aperture module of claim 8 configured to adjust an amount of light incident to the lens barrel; and
    an image sensor configured to convert incident light through the lens barrel into an electrical signal.

10. A position detecting device for detecting a position of a magnet configured to move over a first target point, a second target point, and a third target point in steps, the position detecting device comprising:
    a first hall device configured to generate a first hall voltage;
    a second hall device configured to generate a second hall voltage;
    a subtractor circuit configured to generate a subtraction voltage comprising a difference between the first hall voltage and the second hall voltage;
    an adder circuit configured to generate an addition voltage comprising a combination of the first hall voltage and the second hall voltage;
    a divider circuit configured to calculate a ratio of the subtraction voltage to the addition voltage; and
    a subtraction voltage changing unit circuit configured to maintain the subtraction voltage at two adjacent target points among the first target point, the second target point, and the third target point and in a transition section between the two adjacent target points to be constant.

11. The position detecting device of claim 10, wherein the first hall device and the second hall device are disposed in a moving direction of the magnet.

12. The position detecting device of claim 10, wherein the subtraction voltage changing unit circuit is configured to change the subtraction voltage at a first transition section between the first target point and the second target point to a subtraction voltage lastly obtained at the first target point before the first transition section.

13. The position detecting device of claim 10, wherein the subtraction voltage changing unit circuit is configured to apply a first correction coefficient to the subtraction voltage at the second target point after the first transition section and to calculate a correction subtraction voltage at the second target point.

14. The position detecting device of claim 13, wherein the first correction coefficient corresponds to a ratio of a subtraction voltage firstly obtained at the second target point to the subtraction voltage lastly obtained at the first target point.

15. The position detecting device of claim 13, wherein the subtraction voltage changing unit circuit is configured to change a subtraction voltage in a second transition section between the second target point and the third target point to a correction subtraction voltage lastly obtained at the second target point before the second transition section.

16. The position detecting device of claim 15, wherein the subtraction voltage changing unit circuit is configured to apply a second correction coefficient to a subtraction voltage at the third target point after the second transition section and to calculate a correction subtraction voltage at the third target point.

17. The position detecting device of claim 16, wherein the second correction coefficient corresponds to a ratio of a subtraction voltage firstly obtained at the third target point to the subtraction voltage lastly obtained at the second target point.

18. The position detecting device of claim 10, further comprising:
a differential amplifier configured to differential-amplify output voltages output by the first hall device to generate the first hall voltage, and differential-amplify output voltages output by the second hall device to generate the second hall voltage.

19. A position detecting device, comprising:
first and second hall devices spaced apart in a moving direction of a magnet;
a subtractor circuit configured to determine a difference between outputs of the hall devices as a subtraction voltage;
an adder circuit configured to determine a summation of outputs of the hall devices as an addition voltage;
a divider circuit configured to determine a ratio of the subtraction voltage to the addition voltage;
a subtraction voltage changing unit circuit configured to maintain the subtraction voltage at a constant value when the magnet is in a transition position between target positions,
wherein the magnet position in the transition position is determined by the ratio.

20. The position detecting device of claim 19, wherein the constant value of the subtraction voltage is a value determined at a last target position of the magnet prior to the transition position.

21. A camera module comprising:
a lens barrel disposed in a housing;
an aperture comprising a magnet configured to move over targets, and in a transition section between the targets to adjust an amount of light incident to the lens barrel;
a driver circuit configured to output a driving signal to a coil to move the magnet over the targets and in the transition section, in response to an input signal and a feedback signal;
a position detecting device configured to determine an amount of incident light through the aperture, the position detecting device comprising:
first and second hall devices spaced apart and configured to output voltages in response to the magnet position;
a subtractor circuit configured to determine a difference between outputs of the hall devices as a subtraction voltage;
an adder circuit configured to determine a combination of outputs of the hall devices as an addition voltage;
a divider circuit configured to determine a ratio of the subtraction voltage to the addition voltage;
a subtraction voltage changing unit circuit configured to maintain the subtraction voltage at a constant value when the magnet is in the transition section between target positions; and
an image sensor configured to convert incident light through the lens barrel into an electrical signal,
wherein the feedback signal comprises the ratio of the subtraction voltage to the addition voltage output from the divider circuit as changed by the subtraction voltage changing unit circuit.

22. The camera module of claim 21, wherein the first hall device and the second hall device are spaced apart in a moving direction of the magnet.

23. The camera module of claim 21, wherein the constant value of the subtraction voltage is a value determined at a last target position of the magnet prior to the transition section.

* * * * *